United States Patent [19]

Sarac

[11] Patent Number: 4,612,668
[45] Date of Patent: Sep. 16, 1986

[54] FM WIRELESS TRANSMITTER

[76] Inventor: Vinko Sarac, 114 Richbell Rd., Apt. 4-B, Mamaroneck, N.Y. 10543

[21] Appl. No.: 633,482

[22] Filed: Jul. 23, 1984

[51] Int. Cl.$^4$ .................. H04B 1/34; H04B 1/03; H04B 1/04
[52] U.S. Cl. .................. 455/120; 455/128; 455/129; 343/702; 334/80
[58] Field of Search .............. 455/128, 129, 120, 100; 334/80; 343/702, 872, 873; 331/68, 177 V

[56] References Cited

U.S. PATENT DOCUMENTS

| | | | |
|---|---|---|---|
| 2,085,223 | 6/1937 | Kolster | 334/80 |
| 2,611,094 | 9/1952 | Rex | 334/80 |
| 3,105,938 | 10/1963 | Onnigian et al. | 455/128 |

Primary Examiner—Jin F. Ng
Assistant Examiner—Elissa Seidenglanz
Attorney, Agent, or Firm—Richard L. Miller

[57] ABSTRACT

A FM wireless headphone transmitter which uses a novel technique of varying the transmitted frequency. Instead of the traditional methods of using a variably meshing multi-plate capacitor, the invention uses a printed circuit inductance with a tuning plate attached permanently to the inside of the case so that frequencies are changes by changing cases. An alternative embodiment uses interchangeable tuning plates attached to the inside of the case by hook and loop pile type fastener material. The printed circuit inductance also serves as a transmitting antenna.

3 Claims, 4 Drawing Figures

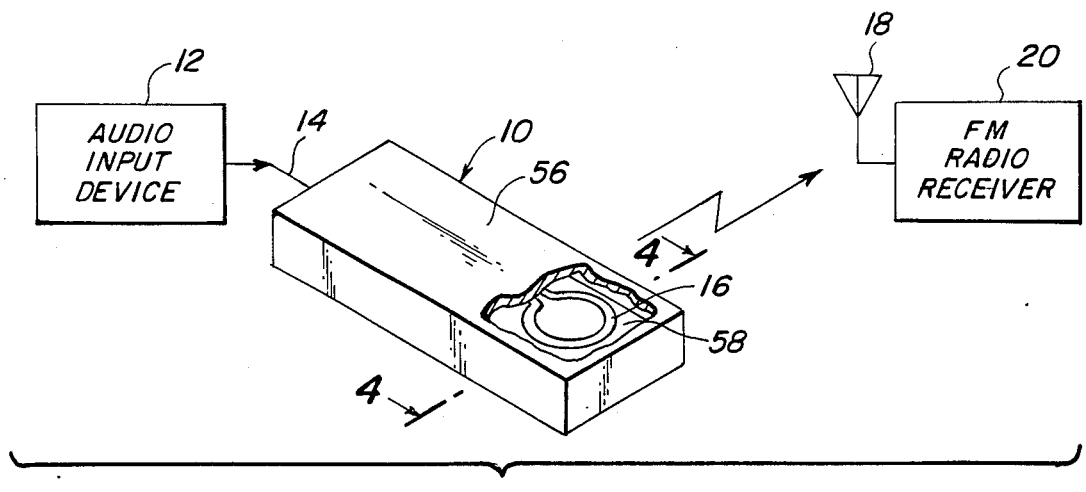
Fig. 1
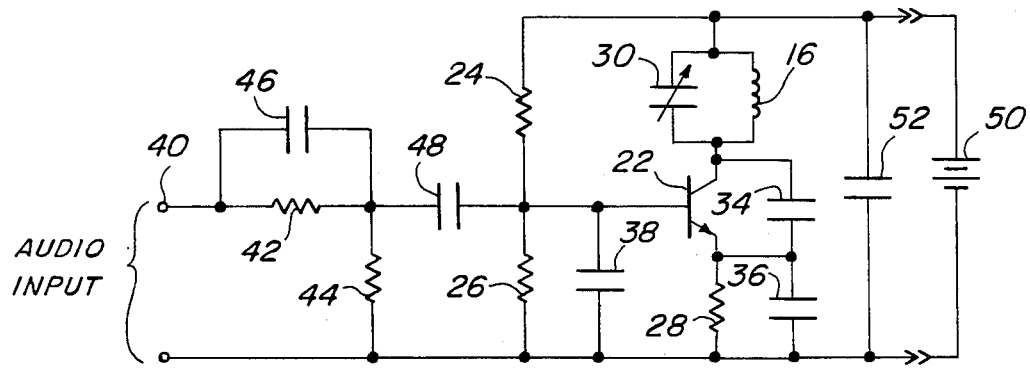
Fig. 2
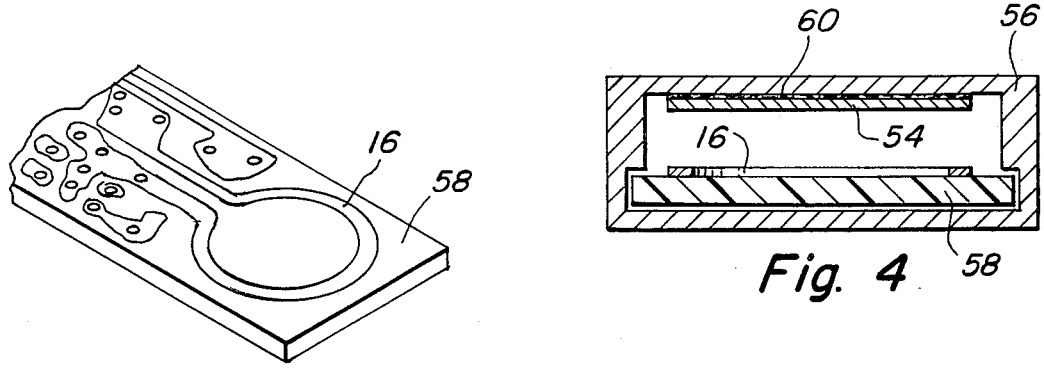
Fig. 3
Fig. 4

FM WIRELESS TRANSMITTER

BACKGROUND OF THE INVENTION

The present invention relates generally to the field of radio transmitters and, more specifically, to portable devices used to transmit music and voice into local FM radio receivers.

A number of transmitting devices are presently available which are capable of transmitting a frequency modulated signal into local receivers, however, they all suffer from complexity and difficulty in adjusting the output frequency of the transmitter. For example, (B. Trask U.S. Pat. No. 4,021,737; R. Redfield et al. U.S. Pat. No. 3,122,847 and R. Palmer U.S. Pat. No. 3,296,916) all provide portable transmitting systems which are tuned by a rotary type capacitor. Once adjusted, their oscillator frequencies may be reset by unauthorized personnel.

SUMMARY OF THE INVENTION

It is, therefore, a primary object of the present invention to provide an FM wireless transmitter which is simple in construction and may be fabricated on a single printed circuit board.

Another object is to provide an FM wireless transmitter in which the frequency controlling inductance is a printed circuit inductor.

Another object is to provide an FM wireless transmitter in which the frequency of the output of the transmitter oscillator is varied by varying a meshed plate type variable capacitor.

A further object is to provide an FM wireless transmitter in which the frequency of the output of the transmitter oscillator is varied by varying the surface area and spacing of a metal plate which is permanently attached to the case. The metal plate is adjacent to the printed circuit inductance. The frequency of the transmitter may be varied by exchanging cases.

A further object is to provide an FM wireless transmitter in which the frequency of the output of the transmitter oscillator is varied by exchanging metal plates of varied surface area and spacing. The metal plates are temporarily attached to the inside of the case by mating strips of hook and loop pile type fastener material. The metal plate is adjacent to the printed circuit inductance.

A yet further object is to provide an FM wireless transmitter in which the printed circuit inductance also serves as a radiating antenna.

Further objects of the invention will appear as the description proceeds.

To the accomplishment of the above and related objects, this invention may be embodied in the form illustrated in the accompanying drawings, attention being called to the fact, however, that the drawings are illustrative only and that changes may be made in the specific construction illustrated and described within the scope of the appended claims.

BRIEF DESCRIPTION OF THE DRAWING FIGURES

The figures in the drawings are briefly described as follows:

FIG. 1 is a diagrammatic view partly in perspective with parts broken away showing the invention in use.

FIG. 2 is a schematic diagram of the invention

FIG. 3 is a partial perspective view of a printed circuit board showing the loop antenna thereon.

FIG. 4 is a cross sectional view taken on line 4—4 in FIG. 1.

DETAILED DESCRIPTION OF THE PREFERRED EMBODIMENTS

In FIG. 1, the invention 10 is shown with an audio input device 12, which may typically be a phonograph or a tape player, connected via input cable 14, to the invention 10, whose printed circuit inductance 16 transmits a frequency modulated radio carrier to antenna 18 on FM radio receiver 20.

The operation and tuning of the invention 10 itself may best be understood with reference to FIGS. 2, 3 and 4. An NPN transistor 22 is provided with base bias by voltage divider network consisting of resistors 24 and 26. Emitter biasing is provided by resistor 28. The output frequency of the oscillator is determined by the resonant frequency of capacitor 30 and printed circuit inductor 16. Feedback and phase shifting necessary for sustained oscillation by a capacitive voltage divider consisting of capacitors 34 and 36. Radio frequency signals are shorted from the base of transistor 22 to ground by bypass capacitor 38. Audio input from terminal 40 is given pre-emphasis, a form of audio shaping by R-C circuits consisting of resistors 42 and 44 and capacitors 46 and 48. Power is supplied by battery 50 which is bypassed for audio and RF frequencies by bypass capacitor 52.

Tuning of capacitor 30 may be accomplished in a variety of ways. Capacitor 30 may be a variably meshed capacitor. Another technique is to bond a metal plate 54 to case 56. Printed circuit inductance 16 part of printed circuit board 58, clearly seen in FIGS. 3 and 4 is in close proximity to plate 54. The total surface area, plate spacing, and the dielectric properties, if any, will affect the tuning capacitance and therefore the output frequency of the transmitter. By exchanging cases which have different dimensioned plates 54 attached to them frequency may be changed. The same case could also be used by attaching varied dimensioned plates to the underside of case 56 by mating strips of hook and loop pile type fastener material 60.

While certain novel features of this invention have been shown and described and are pointed out in the annexed claims, it will be understood that various omissions, substitutions and changes in the forms and details of the device illustrated and in its operation can be made by those skilled in the art without departing from the spirit of the invention.

What is claimed is:

1. An FM wireless transmitter, comprising in combination:
    (a) an electronic oscillator mounted to a printed circuit board;
    (b) a printed circuit inductances which is part of the frequency determining reactance of an LC circuit and also serves as a radiating antenna;
    (c) a metal plate in close proximity to said printed circuit board;
    (d) said metal plate attached to a case which surrounds said printed circuit board and forming a capacitance with said LC circuit, where said plate is exchangeable with other plates of varied surface area and casing is interchangeable with other casings having different dimensioned plates attached therein to change the capacitance to thereby vary the resonant frequency of said LC circuit;

(e) an audio input which modulates the frequency of said oscillator, thereby producing a frequency modulated signal; and (f) a power source for said oscillator.

2. An FM wireless transmitter, as recited in claim 1, wherein said metal plate is permanently attached to the inside of said case in close proximity to said printed circuit inductor; whereby cases with plates of differing sizes and spacing may be interchanged in order to output different radio frequencies.

3. An FM wireless transmitter as recited in claim 1, wherein the metal plate is firmly yet removably attached to said case by mating hook and loop pile type fastener material attached to the inside of said case in close proximity to said printed circuit inductor; whereby said hook and loop pile fastener also serves as a spacing material, and whereby plates of differing sizes and spacing may be interchanged in order to output different radio frequencies.

* * * * *